United States Patent [19]

Orwell

[11] Patent Number: 4,896,282
[45] Date of Patent: Jan. 23, 1990

[54] FLOW COMPUTER CALIBRATION TECHNIQUE

[75] Inventor: Cavan Orwell, Basingstoke, England

[73] Assignee: Schlumberger Electronics (U.K.) Limited, Farnborough, England

[21] Appl. No.: 141,773

[22] Filed: Jan. 7, 1988

[30] Foreign Application Priority Data

Jan. 8, 1987 [GB] United Kingdom ............... 8700403

[51] Int. Cl.$^4$ .......................................... H03M 1/10
[52] U.S. Cl. ............................. 364/571.05; 341/120; 364/571.01; 371/16.1
[58] Field of Search .................... 364/571.01, 571.02, 364/571.04, 571.05, 571.07, 571.08; 371/15, 20, 24; 341/110, 120

[56] References Cited

U.S. PATENT DOCUMENTS

| | | | |
|---|---|---|---|
| 4,280,196 | 7/1981 | Hornak et al. | 341/110 |
| 4,340,882 | 7/1982 | Maio et al. | 341/120 |
| 4,353,060 | 10/1982 | Endoh et al. | 341/110 |
| 4,364,027 | 12/1982 | Murooka | 364/571.05 |
| 4,446,715 | 5/1984 | Bailey | 364/571.02 |
| 4,465,995 | 8/1984 | Sloane | 371/15 |
| 4,580,126 | 4/1986 | Kato et al. | 341/120 |
| 4,680,723 | 7/1987 | Whinray et al. | 364/571.05 |
| 4,692,738 | 9/1987 | Suzuki | 341/110 |
| 4,734,678 | 3/1988 | Take et al. | 364/571.02 |
| 4,758,781 | 7/1988 | Ueno et al. | 371/15 |

Primary Examiner—Parshotam S. Lall
Assistant Examiner—Kevin J. Teska
Attorney, Agent, or Firm—Sanford J. Asman

[57] ABSTRACT

A method of calibrating a process computer, of the kind including an analogue to digital converter for converting analogue input signals representative of measured process parameters into digital signals for processing within the computer, and a digital to analogue converter for converting the processed signals into analogue output signals, comprises applying a known analogue signal to the analogue to digital converter, comparing the resulting digital signal with its expected value, and computing and storing a first calibrating correction value in dependence on the difference. A known digital signal is then applied from within the computer to the digital to analogue converter, whose output is coupled back to the input of the analogue to digital converter for conversion thereby and correction in accordance with the first calibrating correction value. A second calibrating correction value is then computed from the difference between the corrected output of the analogue to digital coverter and the known digital signal, the second value being stored for use in relation to the digital to analogue converter.

12 Claims, 2 Drawing Sheets

FLOW COMPUTER CALIBRATION TECHNIQUE

This invention relates to converter calibration, and in particular to the calibration of values derived from and supplied to analogue to digital and digital to analogue converters for use in instrumentation.

Given the power and flexibility of present day microcomputers it is commonplace to carry out the processing of instrumentation signals, as might for example be derived from a transducer, digitally by means of such a micro-computer. Typically a transducer supplies and analogue signal representative of a parameter being sensed, which signal must be analogue to digital converted before processing can occur. The result of such processing might be a digital output or numeric display, however in some applications of such a process computer, an analogue output is required, for example for the control of plant or interfacing with other equipment capable of accepting only analogue signals.

An example of an application in which a process computer might be employed is in flow metering. In flow metering, notably the metering of the transfer of hydrocarbons such as oil or gas, several transducers are involved, and a process computer used to derive the required outputs from the quantities and parameters measured. For example, in order to provide an output in terms of the energy value of a metered hydro-carbon product flow rate, pressure, temperature and calorific value must all be measured, and the measured values used as inputs to an equation defining energy value in terms of these variables. Typically individual transducers each provide an output representative of one of the quantities to be measured, which are then relayed to a central process computer embodying the equation to be applied to derive the desired quantities. An additional function of the process computer might be to apply a correction equation, for example to linearise transducer response, to the measured values of the individual variables.

Transducer output is typically an analogue signal representative of the measured value, for example in the range 4–20 mA. Where a micro-computer based process computer is used, such signals must be first analogue to digital converted before the correction and the flow equations, embodied in programmes to be executed by the micro-computer, may be applied. The process computer may provide one or more digital outputs (for communication to another computer, for example) representative of corrected and computed values, a numeric readout (for local display, for example) and one or more analogue outputs, which could be used for plant control (e.g. to control a valve) or supplied to analogue equipment (e.g. a chart or strip recorder). A convenient way of providing an analogue output is by digital to analogue conversion of the digital outputs. Thus a typical process computer might include several analogue inputs, an analogue to digital converter for each input feeding data to a micro-computer, various digital and numeric display outputs and a plurality of digital to analogue converters for providing analogue outputs.

The accuracy demanded of a flowmetering installation is high, and might for example be 0.1% (of full scale) in fiscal metering applications. Clearly the converters of a process computer must be accurately calibrated to at least this accuracy. Converters typically take the form of electronic circuits (often integrated circuits) mounted, for example, on printed circuit boards. Calibration is performed by on-board setting of adjustable components, for example potentiometers, associated with each converter. For integrating converters adjustment of feedback components might be involved and for approximation types reference voltage scaling could be required.

Converter calibration represents a significant component of the cost of manufacture of a process computer. Unfortunately calibration does not integrate well with printed circuit board assembly practice, since a board carrying a converter must be removed to a calibration rig, where it is powered and special test signals, applied prior to adjustment by a skilled technician.

Process computer converters, in common with other instrumentation, should be periodically re-calibrated to ensure continuing accuracy. Generally this involves removal of the computer from its installation and return to a calibration rig of the type used originally in manufacture. This again can be an expensive operation, and not just in terms of the calibration itself, particularly if plant which is usually monitored by the process computer has to be shut down.

According to a preferred implementation of the present invention a method for converter calibration in a process computer having at least one analogue input, an analogue to digital converter, computer means operative upon converted values and having a digital output, and a digital to analogue converter for providing an analogue output from the digital output, includes the steps of: relies on the provision of an analogue reference source within the process computer, and the use of the computer means to calculate and store respective calibration correction values for the two converters. Thus the reference source is applied to the analogue input of the analogue to digital converter, and a first calibration correction value is calculated from the difference between the expected and actual output values from the analogue to digital converter, and then stored. The analogue output of the digital to analogue converter is then connected to the analogue input in place of the reference source, and a known digital signal is applied to the digital to analogue converter. The analogue output of the digital to analogue converter is converted back into a digital signal by the analogue to digital converter, this time using the first calibration correction value to correct the conversion. The result of the corrected conversion is then compared with the known digital signal, and a second calibration correction value is calculated on the basis of the comparison and stored. At this point, the process computer is calibrated and ready for use.

Several advantages of the invention will be apparent to those skilled in the art. Firstly, since the calibration is achieved by the application of calibrating correction values by the computer means, no physical converter calibration is required. Instead, converters may be assembled to operate with broad limits which removes the need for calibration during manufacture. Furthermore, since no physical adjustment is required, calibration and re-calibration can be achieved without removal from an installation. For example calibration may be performed by entering a computer command to initiate a programme to carry out the calibration steps, the only manual intervention being connection of a known signal source (for calculation of the first calibrating correction value) and connection of the analogue output to the analogue input (for determination of the second calibrating correction value). Alternatively, where the known signal source and/or the connection means are configured within the process computer, these operations may themselves be automated under programme control. Thus, in a preferred embodiment of the present invention, a self calibrating process computer is provided which may periodically perform a recalibration, for example, to take account of long term converter drift.

Advantageously limiting values may be imposed upon the first and second calibrating correction values and when, during calibration, these values are exceeded, an indication provided that the process computer has developed a possible fault. For preference the first and second calibrating correction values, together with other parameters required for the operation of the computer, are stored in memory associated with the computer means.

For more precise calibration over a range, for example for linearity correction, a plurality of different known signal sources may be applied and a plurality of first calibrating correction values calculated, in relation to a plurality of expected values. Additionally or alternatively, a plurality of second calibrating correction values may be calculated in relation to a plurality of different expected digital values. It will be further appreciated that the present invention may be readily applied to process computers including a plurality of analogue to digital and digital to analogue converters. Where more that one converter is involved, means are preferably included for cross-connection so that derived first and/or second calibrating correction values may be cross checked between converters.

In order that features and advantages of the present invention may be further appreciated, an embodiment will now be described, by way of example only, with reference to the accompanying diagrammatic drawings, of which:

Figure 1:
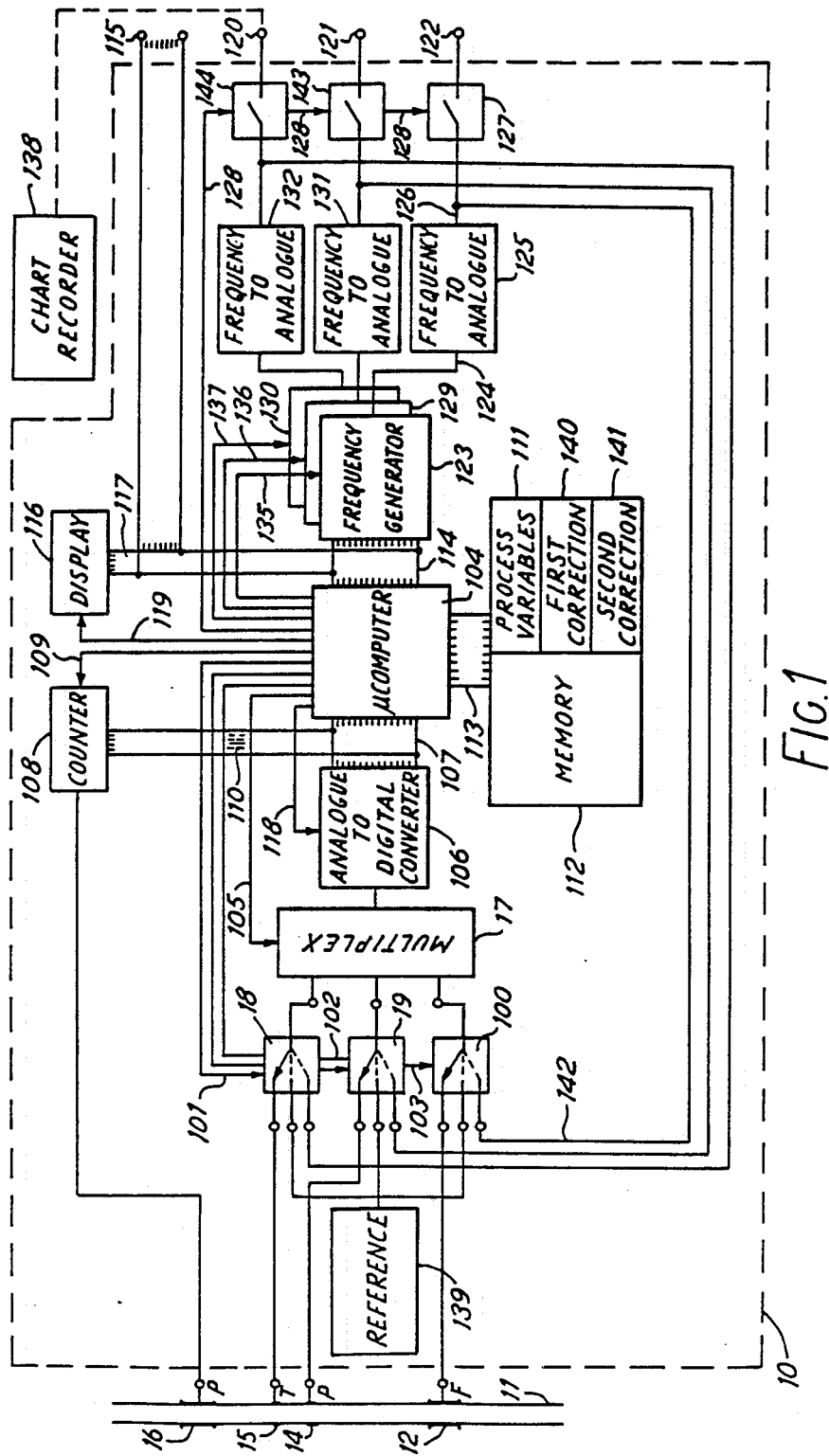
FIG. 1 represents a process computer in accordance with the present invention.

A process computer 10 (FIG. 1) is arranged to monitor the flow of a fluid in a pipe line 11. To this end, a flow transducer 12, a pressure transducer 14, a temperature transducer 15 and a density transducer 16 are mounted on the pipe 11. The flow transducer, which might for example be of the magnetic type, produces an analogue signal F in the range of 4–20 mA (as is standard practice in the art) representative of fluid flow rate, while pressure transducer 14 and temperature transducer 15 respectively produce analogue signals P and T, again in the range 4–20 mA.

Density transducer 16, which may be of the vibrating tube type as described in United Kingdom Patent No. 2 062 865, produces a signal P in the form of a periodic signal, the instantaneous frequency of which is representative of fluid density.

Values of the T, P and F signals are relayed to a multiplexer 17 by appropriate positional selection of switches 18 19, 100 in accordance with control signals 101, 102, and 103 respectively, which are supplied by a micro-computer 104. Multiplexer 17, under control of a control signal 105, again supplied by the micro-computer 104, is arranged to select one of the T, P, or F signals for onward transmission to an analogue to digital converter 106. Thus, samples of the values of the T, P and F signals may be made available to the micro-computer 104, via data-highway 107, by appropriate generation of a control signal 105, which may for example comprise a plurality of bits. Also available to the micro-computer 104 are samples of the value of the signal P from the density transducer 16. Since the signal P is of a frequency proportional to density, samples are derived by counting cycles of the signal P in a counter 108 within a period fixed by a signal delivered via a control line 109 by micro-computer 104. The counter output at the end of a counting period, which is representative of a sample of the P signal is available to the micro-computer 104 via data-lines 110, which are connected to the data highway 107.

The micro-computer 104 is programmed to operate upon received samples of the P, T P, and F signals, in accordance with well known flow equations which are functions of these variables to provide computed values of parameters of flow conditions such as for example calorific value of a flowing product, or mass flow. Generally the equations will require knowledge of process variables 111, such as for example pipe diameter, including any correction factors to be applied to P, T, P and F sample values before use. These process values are entered into a memory 112 associated with the microcomputer 104, and made available via a data highway 113.

Operation of the micro-computer 104 yields computed values as aforesaid, which may be made available directly as digital values on a digital output 114, having an external termination 115. Alternatively, such values and other parameters may be displayed on a display 116, to which they are loaded via data lines 117 (under control of a control signal 119,) and which are themselves connected to the digital output 114.

The process computer as thus far described operates in a conventional way, and its implementation will be readily apparent to those skilled in the art. Ways in which micro-computer 104 may be programmed to provide appropriate control signals 101, 102 and 103 to control switches 18, 19 100 respectively, the control signal 105 to control multiplexer 105, a control signal 118 to activate the analogue to digital converter 106, the control signal 109 to enable the counter 108, and the control signal 119 for the display 116, will also be familiar to those skilled in the art.

Programme control of the micro-computer 104 to operate upon the sample values of the T, P and F signals available via analogue to digital converter 106, the P signal via counter 108 and the accessing of process variables loaded into memory (by means not shown, but which are well known) will also be understood by those skilled in the art. The elaboration of such well known detail has been minimised in FIG. 1 for the purpose of clarity.

It will be appreciated that a process computer as thus far described is capable of providing a display of calculated values-representative of flow conditions based on measured and process variables. Such variables may also be output in digital form via output 114 and termination 115, for example for delivery to a data logger or other computer. Generally, however, there is demand for process computers to provide analogue outputs in addition to numeric display and digital outputs. To this end, the embodiment of FIG. 1 includes three digital to analogue converters providing analogue outputs 120, 121, 122.

The digital to analogue converters may be of any convenient type, and for example each comprise a frequency generator, such as frequency generator 123, which generates a signal on line 124 proportional in frequency to a digital value received from the microcomputer 104 via the digital output 114, and a frequency to analogue converter, such as converter 125, which generates an analogue signal on line 126 in response to the frequency of a signal on line 124. When switch 127 is closed, by generation of a suitable control signal on line 128, the analogue signal 126 is relayed to analogue output 122. Analogue signals may similarly be relayed to analogue outputs 120 and 121 by means of frequency generators 129 and 130, frequency to analogue converters 131 and 132 and switches 133 and 134 (also controlled by signal line 128) respectively. Control signals 135, 136 and 137, generated by means of microcomputer 104 under program control, respectively control frequency generators 123, 129 and 130 to produce an output whenever data appropriate to output 122, 121 or 120 is present at the digital output 114.

The analogue signal generated may be representative of any value calculated by the micro-computer, for example corrected values of density, temperature, pressure or flow, or delivered calorific value or mass flow. The analogue outputs may control external plant or recording apparatus, such as output 120 driving a chart recorder 138.

It will be apparent that the calibration of the converters (that is analogue to digital converter 106, including multiplexer 17, and the digital to analogue converters constituted by frequency generator/frequency to analogue converter pairs 123, 125; 129, 131; and 130, 132) materially affects the accuracy of the overall process computer. Indeed, both during manufacture and subsequent re-calibration of prior art process computers, proportionally a great deal of effort and expense is devoted to these calibrations. For example, if analogue to digital converter 106 were of the integrating type, adjustment of feedback gain control components, reference voltage and time base components might all be required. In any event, process computer components, for example printed circuit boards, must be powered and special signals input and monitored for the adjustments to be made.

In accordance with an objective of the present invention, which is to reduce, and for the most part eliminate, the need for these calibration operations, the present embodiment of the invention is arranged to have a calibration mode, in which operation proceeds as follows.

Firstly, micro-computer 104 is programmed to generate a control signal on line 103 such that switch 100 is indexed to its central position to thereby connect a reference signal from a reference source 139 to multiplexer 17. A control signal 105 is generated to connect the reference signal to analogue to digital converter 105 which is activated (control 118) to produce a conversion. The expected value of the conversion is defined by the actual value of reference signal, but normally the converted value will differ from this expected value because the converter is uncalibrated. The micro-computer is arranged to calculate and store in memory 112 a first calibrating correction 140 based upon the difference between the expected value and the converted value.

Secondly, switch 100 is indexed so that connection is made to the analogue output 126 of the output of the frequency to analogue converter 125 via connection line 141. Micro-computer 104 is arranged to now provide a predetermined digital output, which may for example be equivalent to the value of the reference signal. Frequency generator 123 is controlled (135) to generate a frequency in response to this digital output and frequency to analogue converter 125 an analogue equivalent output thereof, which is relayed back to analogue to digital converter 106 via line 141, switch 100 and multiplexer 17. Converter 106 converts the so generated signal into a digital representation available on data highway 107. Micro-computer 104 is programmed to receive this representation and apply the first calibrating correction 140, as stored in memory 112, to yield a value for the representation as corrected and to compare it with an expected value, being that of the predetermined digital output. Micro-computer 104 is arranged to calculate the difference between the expected value and the actual value of the representation to which the first calibrating correction has been applied and, based on this difference, to provide another digital output such that the difference is reduced. A new difference value is computed, and the process continued and repeated until the difference is reduced to zero. The micro-computer is programmed, upon achieving a zero difference, to calculate a second calibrating correction based upon the difference, between the digital output value when zero difference is achieved and the output value that would be expected to provide that output, that is the initial predetermined value.

Second calibrating correction 141 is stored in memory 112, and may be applied in process use by the micro-computer 104 as will be described hereinafter. Firstly, however, the theoretical basis for the calibrating corrections may be considered.

Figure 2:
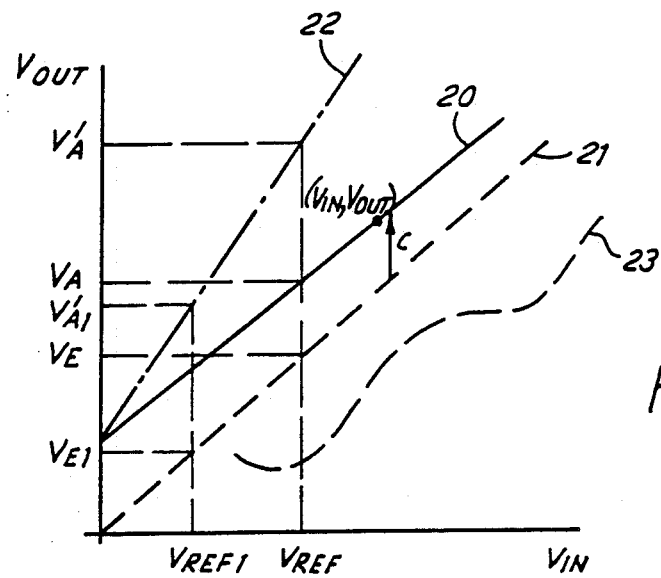
FIG. 2 represents converter characteristics.

Analogue to digital converter 106 will have a certain transfer function, as for any value applied at its analogue input ($V_{in}$) it will provide a particular digital output value ($V_{out}$). This relationship may be graphed (FIG. 2) to show the locus 20 of a generalized point ($v_{in}$, $v_{out}$) on the axes $V_{in}$ (abcissa) and $V_{out}$ (ordinate), which are to the same scale. For an ideal converter, this locus would be a straight line (21) intersecting both axes at zero and of slope 45° so that $V_{out}$ is equal to $V_{in}$ for all its possible values. Unfortunately, an ideal converter cannot be realised in practice and for a practical converter the locus will lie elsewhere. With modern integrated circuit converters, the locus might, for example, be of the correct slope, but offset from the ideal; this applies to locus 20. Calibration is the process of correcting for this deviation and is carried out in prior art process computers by altering components in the converter circuitry to bring the locus of points ($v_{in}$, $v_{out}$) onto the ideal 21. The present invention provides means for avoiding such calibration, by providing calibration corrections storable for use during computation.

Given that locus 20 represents the transfer function of an actual analogue to digital converter then it can be seen that:

$$V_{out} = V_{in} + c,$$

where c is the intercept (the point (0, c)) of locus 20 with the $V_{out}$ axis.

In accordance with the present invention, a known signal, for example of value $V_{REF}$, applied to the analogue input of the process computer produces a digital output value of $V_A$ (locus 21) as against an expected value of $V_E$ for a converter with the ideal transfer function (locus 21). Micro-computer 12 is arranged to calculate the difference between the actual and expected values to provide a first calibrating correction ($c = V_A - V_E$) for storage in memory 112 as aforesaid. It will be appreciated that this first calibrating correction may later be subtracted from conversion outputs ($V_{out}$) given by analogue to digital converter 106 so that a digital representation of the actual value of analogue input ($V_{in}$) may be available with the micro-computer 104 for use in subsequent calculations.

It will be realised that an offset transfer function such as that described above represents a fairly simple case of a first calibrating correction. A more general case might be where a converter exhibits linearity i.e. the transfer function is a straight line), but it is both offset and of different slope (locus 22) with respect to the ideal (21). Here, a reference signal input, V,REF' yields an output value $V_A$ as against an expected value $V_{E1}$. However, in order to determine the first calibrating correction, the micro-computer 104 is programmed to apply a second reference signal $V_{REF1}$ which provides a digital output V as against an expected value $V_{E1Q}$. It may be shown that $V_{out} = M V_{in} + c$, and hence:

$$V_1 = M V_{REF} + c, \text{ and}$$
$$V_{A1} = M V_{REF1} + c.$$

Micro-computer 104 is programmed to solve these simultaneous equations to yield a first calibrating correction (M, c), which values may be stored (140) in memory 112. Yet more generally, the locus of points ($V_{in}$, $V_{out}$) might be any function, for example function $f(V_{in})$, 23. Here $V_{out} = f(V_{in})$.

In such a situation, micro-computer 104 is programmed to apply a plurality of reference voltages, each of which yields a calibrating correction value ($V_A - V_E$) forming part of the first calibrating correction. In use, when an analogue input $V_{in}$ produces a converted value $V_{out}$ the appropriate calibrating correction value may be applied by access by micro-computer 104 to the appropriate first calibrating correction value 140 stored in look-up table format in memory 112. Where $V_{out}$ differs from a value for which a calibrating correction value is stored, micro-computer 104 may be programmed to interpolate from proximate calibrating correction value.

It will be apparent to those skilled in the art that a plurality of reference sources may be included in a process computer for this process, and may be selectively connected under program control, for example by an arrangement of switches, such as to replace switch 18. Alternatively, the micro-computer may be arranged to instruct, for example by means of display 116 the connection of external sources for example by an operator. One of the references might conveniently be a zero input, and it will be realised that calibrating corrections of the type $V_{out} = M V_{in} + c$ may thus be derived with a single active reference source.

Similar considerations apply to calibrating correction of the outputs of the digital to analogue converters constituted by frequency generators 123, 129, and 130 and frequency to analogue converters 123, 131 and 132 respectively. The transfer function of a practical converter might depart from the ideal in any of the ways mentioned above with respect to converter 106.

Figure 3:
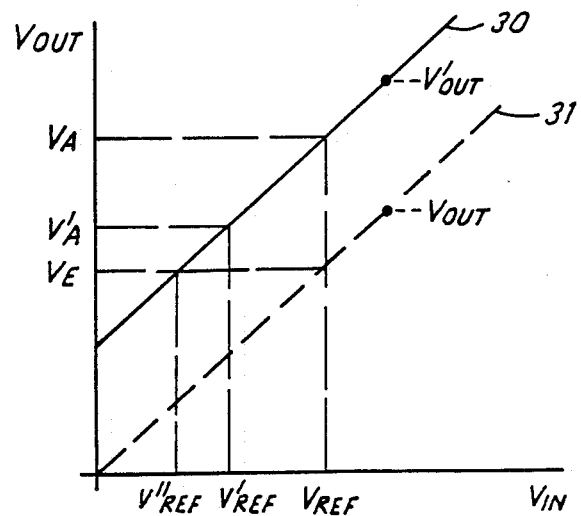
FIG. 3 represents alternative converter characteristics.

Taking an example of a converter having the transfer function 30 (FIG. 3) with respect to an ideal 31, micro-computer 104 is programmed to generate a digital output value at digital output 114 representative of a predetermined value, for example $V_{REF}$, and controls frequency generator 123 such that a frequency is generated resulting in an analogue converter 125. In accordance with the transfer function (30), this output will be of value $V_A$, as against an expected value of $V_E$ (read from ideal, 31).

The output is available on line 141 and micro-computer 104 selects switch 100 and multiplexer 105 such that it is connected to the input of analogue to digital converter 106. Thus, a digital representation of the analogue output is available to the micro-computer 104, to which the first calibrating correction may be applied to yield an actual value for this output.

Micro-computer 104 is programmed to calculate the difference between the actual and expected values ($V_A - V_E$) and provide a new digital output, $V'_{REF}$ such that the difference ($V'_A - V_E$) is reduced. This part of the programme is repeated until a digital representation of $V_{REF}$ is output, being the output for which the difference is zero.

From the difference between this later digital output and the value expected to produce a zero difference (that is the initial digital output) micro-computer 104 is programmed to compute a second calibrating correction 141 to be stored in memory 112.

It will be appreciated that the derivation of a second calibrating correction as described above is sufficient to establish a single point calibrating correction, that is the calibrating correction of a measured value $V'_{out}$ to an actual value $V_{out}$, for an offset transfer function of the type of locus 30. It will further be appreciated that, since the process described above allows a single point calibrating correction to be computed, further calibrating correction points may be computed by application of alternative predetermined digital outputs to accommodate, for example, differences of the type $V_{out} V_{in} + c$ (two point calibrating correction required), or $V_{out} = f(V_{in})$ (multiple point calibrating correction required).

Second calibrating corrections for the digital to analogue converters constituted by frequency generators 129, 130 and frequency to analogue converters 131, 132 respectively, may be similarly computed. In use, these second calibrating corrections are applied to the digital output 114 by micro-computer 104 before being selected (under program control) to one of the three analogue to digital converters; thus corrected outputs are available at analogue outputs 122, 121 and 120.

It will be noted that during such second calibrating correction computations, the analogue output of frequency to analogue converter 126 is connected to multiplexer 17 via switch 100, output converter 131 via switch 19 and the output of converter 132 via switch 18. It will be apparent that in this embodiment there are effectively therefore three analogue to digital input channels, and three digital to analogue output channels.

Switches, 127, 143 and 144 are provided and may be activated by a control signal on line 128 to disconnect the final outputs 122, 121 and 120, thereby preventing signals used in calibration correction determination reaching plant or other equipment.

In an alternative embodiment of the present invention, switches may be arranged, for example, to replace switches 18, 19 and 100, so that the analogue output of any digital to analogue converter channel may be connected to the analogue input of any analogue to digital channel. Hence, in this alternative embodiment of the present invention, micro-computer 104 is programmed to perform cross checks, that is to output a digital value, via a first digital to analogue converter with the appropriate second calibrating correction applied and to obtain a digital representation thereof via each of the analogue to digital converters, apply the respective first calibrating correction to each, and to check that the corrected digital representation obtained are acceptably identical. Further cross checks may be obtained by repeating the above cross checks for each of the digital to analogue converter channels. In the event that acceptable identity is not obtained, micro-computer 104 may be programmed to recompute each first and each second calibrating correction as aforesaid. In the event that acceptable identity remains unobtainable, an error may be signalled to be displayed, for example via display 116.

The micro-computer 104 is arranged to periodically re-compute the calibrating corrections, for example at initial switch on and periodically thereafter. Re-calibrations may be performed automatically, without removal of the process computer from its installation. Where plant time constants are long, or where equipment is not in continuous use, re-calibration may be performed interspersed with process functions. A record of first and second corrections may be kept as information about converter reliability. Limiting values may be imposed upon the calibrating corrections which may be accepted. Derivation of a calibrating correction outside a limiting value is indicative that a converter has deteriorated and that it is out of specification. Micro-computer 104 is programmed to flag a warning in such a circumstance.

What is claimed:

1. A method for converter calibration in a process computer having at least one analogue input, an analogue to digital converter, computer means operative upon converted values and having a digital output, and a digital to analogue converter for providing an analogue output from the digital output, including the steps of:
    applying an input signal to one of said converters to establish an output signal therefrom;
    establishing one of the signals as a reference;
    calculating and storing a calibrating correction value for said one converter based upon the difference between an actual value of one of the signals and an expected value thereof;
    connecting the analogue output of the digital to analogue converter to said least one analogue input;
    controlling the computer means to provide a digital output;
    converting the analogue output signal into a digital representation thereof using the analogue to digital converter to give a digital conversion;
    applying the calibrating correction value to the conversion effected by said one converter; and
    calculating and storing a calibrating correction value for the other converter based upon the difference between said digital output and said digital conversion;
    whereby the stored calibrating correction values are applied in process use by the computer means to respectively correct signals received from the analogue to digital converter and signals output to the digital to analogue converter.

2. A method as claimed in claim 1 and wherein the analogue output is established as said reference by accurate measurement thereof.

3. A method as claimed in claim 1 and wherein the analogue input is established as said reference by a connection of a known source thereto.

4. A method as claimed in claim 1 and wherein the steps of calculating and storing the respective calibrating correction values for said one and said other converter are both performed by the computer means.

5. A method for converter calibration in a process computer having at least one analogue input, an analogue to digital converter, computer means operative upon converted values and having a digital output, and a digital to analogue converter for providing an analogue output from the digital output, including the steps of:
    connecting a known signal source to the analogue input;
    converting the known signal to a digital representation thereof using the analogue to digital converter;
    calculating and storing a first calibrating correction value based upon the difference between the actual value of the known signal and the converted digital representation thereof;
    disconnecting said known signal source from the analogue input and connecting the analogue output to the analogue input in place thereof;
    controlling the computer means to provide a digital output;
    using the digital to analogue converter to convert the digital output to an analogue output signal which is thus connected to the analogue input;
    converting the analogue output signal into a digital representation thereof using the analogue to digital converter and applying the first calibrating correction thereto to give a digital conversion; and
    calculating and storing a second calibrating correction value based upon the difference between said digital output and said digital conversion;
    whereby said first and second calibrating correction values are applied in process use by the computer means to respectively correct signals received from the analogue to digital converter and signals output to the digital to analogue converter.

6. A method as claimed in claim 5 and wherein the second calibrating correction value is determined by controlling the computer means to provide a digital output such that said digital conversion is of a predetermined value when said second correction is calculated.

7. A method as claimed in claim 6 and wherein the predetermined value is achieved by initially applying that value as said digital output and determining the difference between this expected value and the actual value of the digital conversion, controlling the computer means to give a subsequent digital output such that the difference is reduced following conversion, and further controlling the computer means until the difference is zero.

8. A method as claimed in claim 5 and wherein the steps of calculating and storing the first and second calibrating correction values are both performed by the computer means.

9. Apparatus for converter calibration in a process computer having at least one analogue input, an analogue to digital converter, computer means operative upon converted values and having a digital output, and a digital to analogue converter for providing an analogue output from the digital output, including:
  means for supplying a known signal source to the analogue input such that the known signal is converted to a digital representation thereof using the analogue to digital converter;
  means for calculating and storing a first calibrating correction value based upon the difference between the actual value of the known signal and the converted digital representation thereof;
  means for connecting the analogue output to the analogue input;
  means for causing the computer means to provide a digital output such that the digital output is converted by the digital to analogue converter to an analogue output signal which is thus applied to the analogue input via said connecting means, the analogue output signal being converted into a digital representation thereof using the analogue to digital converter and applying the first calibrating correction thereto to give a digital conversion; and
  means for calculating and storing a second calibrating correction value based upon the difference between said digital output and said digital conversion;
  whereby the stored first and second calibrating correction values are applied in process use by the computer means to respectively correct signals received from the analogue to digital converter and signals output to the digital to analogue converter.

10. Apparatus as claimed in claim 9 and wherein the means for supplying the known signal source are provided within the process computer.

11. Apparatus as claimed in claim 9 and wherein the means for connecting the analogue output to the analogue input are provided within the process computer.

12. Apparatus as claimed in claim 9 and wherein the respective means for calculating and storing the first and second calibrating correction values are both constituted by the computer means.

* * * * *